United States Patent

Heugebaert et al.

Patent Number: 5,436,119
Date of Patent: Jul. 25, 1995

[54] METHOD FOR RENDERING SILVER AREAS OF A SILVER BASED PRINTING PLATE INK ACCEPTANT WHILE RENDERING THE HYDROPHILIC AREAS INK REPELLANT

[75] Inventors: Franciscus Heugebaert, Mortsel; Gilbert Voortmans, Beerse; Jean-Marie Dewanckele, Drongen; Johan Loccufier, Zijaarde, all of Belgium

[73] Assignee: Agfa-Gevaert, N.V., Mortsel, Belgium

[21] Appl. No.: 238,748

[22] Filed: May 5, 1994

[30] Foreign Application Priority Data

May 13, 1993 [EP] European Pat. Off. ............ 93201424

[51] Int. Cl.6 .......................... G03C 5/40; G03C 5/44; G03C 8/06; G03F 7/07
[52] U.S. Cl. .................................... 430/461; 430/204; 430/309; 430/331; 430/432; 430/248; 430/463; 430/493; 101/465; 101/466
[58] Field of Search ............... 430/204, 205, 461, 463, 430/432, 248, 493, 309, 331; 101/465, 466

[56] References Cited

U.S. PATENT DOCUMENTS

| | | | |
|---|---|---|---|
| 2,297,929 | 10/1942 | Wise | 101/466 |
| 3,260,198 | 7/1966 | Wagemans et al. | 430/205 |
| 3,592,647 | 7/1971 | Blake et al. | 430/204 |
| 4,837,122 | 6/1989 | Kondo et al. | 430/205 |
| 5,068,164 | 11/1991 | Kondo et al. | 430/493 |
| 5,308,746 | 5/1994 | Barnett et al. | 430/205 |

*Primary Examiner*—Richard L. Schilling
*Attorney, Agent, or Firm*—Breiner & Breiner

[57] ABSTRACT

The present invention provides a conversion liquid for converting silver areas of a silver based printing plate into ink repellant areas while rendering background areas of said silver based printing plate ink accepting, said conversion liquid comprising a hydrophobizing compound capable of adsorbing to said hydrophilic background areas and a hydrophilizing compound capable of adsorbing to said silver areas and/or a bleaching compound capable of oxidizing the silver in said silver based printing plate.

5 Claims, No Drawings

METHOD FOR RENDERING SILVER AREAS OF A SILVER BASED PRINTING PLATE INK ACCEPTANT WHILE RENDERING THE HYDROPHILIC AREAS INK REPELLANT

DESCRIPTION

1. Field of the Invention

The present invention relates to a conversion liquid for converting the ink accepting silver areas on a hydrophilic background of a lithographic printing plate into ink repellant areas and the hydrophilic background areas into ink accepting areas.

2. Background of the Invention

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Particular interesting printing plates are those prepared from a silver halide photographic material according to the silver salt diffusion transfer process. The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde-The Focal Press-London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving layer and are reduced therein with a developing agent, generally in the presence of physical development nuclei, to form a silver image having reversed image density values ("DTR-image") with respect to the black silver image obtained in the exposed areas of the photographic material.

The image-receiving layer may be a surface layer on top of the silver halide emulsion layer or may be present as a surface layer on a separate receiving maternal. Since the silver image formed in the image receiving surface layer is hydrophobic or can be rendered hydrophobic it will form the ink accepting portions of the printing plate while the non-silver areas are hydrophilic and thus ink-repellant to greasy inks. According to a further alternative the image receiving layer may be located between a hydrophilic support and the silver halide emulsion layer. After development according to the DTR-process, this silver halide emulsion layer and any optional layer between the image receiving layer and silver halide emulsion layer is removed in e.g. a wash-off process by rinsing e.g. with plain water.

A disadvantage of DTR-printing plates is the fact that they are generally positive working i.e. the image values in the original will also form the printing areas. Several proposals have been made to adapt the DTR photographic material in order to obtain a negative working DTR-printing plate. An obvious draw-back of this approach is that different types of photographic material for a positive and negative working plate are needed which is expensive and inconvenient.

Furthermore, a negative working lithographic printing plate in which a silver image forms the ink accepting areas, hereinafter called silver based printing plate, may also be prepared in a heat mode recording process wherein a metallic silver layer is ablated or rendered ink repellant at areas exposed with a high intensity laser beam. Such method requires that all non-image areas are exposed so that they will not accept ink in a printing process, thus being a time consuming method.

From the above it is clear that a need exists for converting the ink accepting silver areas into ink repellant areas while rendering the initially ink repellant areas ink acceptant towards greasy ink.

3. Summary of Invention

Accordingly it is an object of the present invention to provide a method for switching the ink accepting and ink repellant areas of a silver based printing plate.

Further objects of the present invention will become clear from the description hereinafter.

According to the present invention there is provided a conversion liquid for converting silver areas of a silver based printing plate into ink repellant areas while rendering background areas of said silver based printing plate ink accepting, said conversion liquid comprising a hydrophobizing compound capable of adsorbing to said hydrophilic background areas and a hydrophilising compound capable of adsorbing to said silver areas and/or a bleaching compound capable of oxidizing the silver in said silver based printing plate.

According to the present invention there is also provided a package containing a hydrophilizing liquid and/or a bleaching liquid and a hydrophobizing liquid for use in combination with each other so as to convert silver areas of a silver based printing plate into ink repellant areas and to render background areas of said silver based printing plate ink accepting, said hydrophobizing liquid comprising a hydrophobizing compound capable of adsorbing to said hydrophilic background areas, said hydrophilising liquid comprising a hydrophilising compound capable of adsorbing to said silver areas and said bleaching liquid comprising a bleaching compound capable of oxidizing the silver in said silver based printing plate.

According to the present invention there is also provided a method for converting silver areas of a silver based printing plate into ink repellant areas while rendering background areas of said silver based printing plate ink accepting comprising a treatment of said silver based printing plate with a hydrophobizing compound capable of adsorbing to said hydrophilic background areas and a hydrophilising compound capable of adsorbing to said silver areas and/or a bleaching compound capable of oxidizing the silver in said silver based printing plate.

4. Detailed Description of the Invention

According to a preferred embodiment of the present invention the hydrophilising and/or the bleaching compound and the hydrophobizing compound are contained in an aqueous liquid. Said liquid can be an aqueous solution or an aqueous emulsion. Suitable hydrophilising compounds for use in connection with the present invention are compounds having a group capable of adsorbing to silver either chemically or physically and having one or more hydrophilic groups that render the overall compound hydrophilic or repellant towards greasy ink.

According to a preferred embodiment such group capable of adsorbing to silver is a mercapto group or the tautomeric thione group thereof. Preferred hydrophilic groups are groups that improve the aqueous solubility of a compound, typical examples of suitable hydrophilic groups are e.g. hydroxy groups, amino groups, acid groups e.g. carboxylic acid groups, sulphonic acid groups, sulphinic acid groups, phosphonic or phosphoric acid groups, ammonium groups, sulphonium groups etc. . . .

According to the most preferred embodiment in connection with the present invention a hydrophilizing compound according to following formula (I) is used:

$$\text{MS—R—A} \qquad (I)$$

wherein M represents hydrogen, a metal cation e.g. $Na^+$, $K^+$ etc. . . or $NH_4^+$;

R represents a divalent linking group and

A represents a hydrophilic group e.g. as listed above.

It will be clear to someone skilled in the art that the hydrophilizing compounds, in particular those according to formula (I), may be present in the form of a precursor compound that upon application to the silver areas yields the hydrophilizing compound. For example, the hydrophilizing compounds according to formula (I) may be present in the conversion or hydropylizing liquid as a disulfide. Upon application to the silver areas the disulfide bond will split so that a compound according to formula (I) is formed.

Preferred divalent linking groups R in formula (I) are e.g. an unsubstituted lower alkylene ($C_1$-$C_4$), an unsubstituted phenylene, an oxyalkylene, a polyoxyalkylene, an alkylene substituted with one or more hydrophilic groups, an arylene substituted with one or more hydrophilic groups, an arylenealkylene substituted with one or more hydrophilic groups, an alkylenearylene substituted with one or more hydrophilic groups, a substituted or unsubsituted heterocyclic ring etc. . . .

Examples of hydrophilizing compounds for use in accordance with the present invention are:

Table 1

4-mercaptobutylsulphonic acid and salts thereof
3-mercaptopropylsulphonic acid and salts thereof
4-mercaptobutylcarbonic acid and salts thereof
2-mercapto-1-aminoethylcarbonic acid and salts thereof
3-mercapto-5-sulphomethyl-1,2,4-triazole and salts thereof
2-mercapto-1-carboxymethyl-tetrazole and salts thereof
2-mercapto-1-carboxyphenyl-tetrazole and salts thereof
2-mercapto-5-sulphobenzimidazole and salts thereof
2-mercapto-5-sulphobenzthiazole and salts thereof
2-mercaptomethyl-5-sulphobenzimidazoie and salts thereof
1,2-dimercaptopropylsulphonic acid and salts thereof Suitable hydrophobizing compounds for use in connection with the present invention comprise a group capable of adsorbing to the hydrophilic background areas of the silver based printing plate and that contain a hydrophobic group so that the overall compound is ink accepting towards greasy ink. Suitable hydrophobic groups are for example long chain alkyl, long chain alkenyl, long chain alkynyl, aryl, aralkyl, alkylaryl etc. These groups may be substituted e.g. by fluorine atoms provided their general hydrophobic character is retained. By the term long chain is meant a group having at least 4 carbon atoms, preferably at least 6 carbon atoms.

The type of group capable of adsorbing to the hydrophilic background areas depend somewhat on the type of hydrophilic surface of the silver based lithographic printing plate. Most commonly employed hydrophilic surfaces are aluminium oxide or silicium oxide surfaces.

Particularly suitable groups for adsorbing to these kind of surfaces are acid groups e.g. sulphonic acid groups, phosphonic or phosphoric acid groups and carboxylic acid groups. The most preferred group being a phosphoric acid group.

Preferred hydrophobizing compounds for use in connection with the present invention correspond to formula (II):

$$\{[G—(K)_n—(L)_n—O—]_xPO_{4-x}\}_sQ_t \qquad (II)$$

wherein G represents an alkyl, alkenyl or alkynyl group having at least 6 carbon atoms, an aryl, an alkylaryl or an aralkyl, each of wich groups may be substituted;

K represents a carbonamido or sulphonamido group;

L represents an oxyalkylene or polyoxyalkylene;

n represents 0 or 1;

x represents 1 or 2;

s and t represent the smallest integers to obtain a neutral compound;

Q represents a hydrogen, a metal cation e.g. $Li^+$, $Na^+$, $K^+$, $Ca^{2+}$ etc. or $NH_4^+$;

Examples of hydrophobizing agents suitable for use in connection with the present invention are:

TABLE 2

| Cpd. 1  | $n.C_7F_{15}$—$CO_2$—$NH_4$ |
| Cpd. 2  | $n.C_8F_{17}$—$SO_3$—$Li$ |
| Cpd. 3  | $n.C_{13}H_{27}$—O—$(CH_2$—$CH_2$—O—$)_6$—$PO_3H_2$ |
| Cpd. 4  | $[n.C_{13}H_{27}$—O—$(CH_2$—$CH_2$—O—$)_6]_2$—$PO_2H$ |
| Cpd. 4  | $n.C_{12}H_{25}$—O—$PO_3H_2$ |
| Cpd. 5  | $n.C_{18}H_{37}$—O—$PO_3H_2$ |
| Cpd. 6  | $n.C_{14}H_{29}$—O—$PO_3H_2$ |
| Cpd. 7  | $(n.C_{12}H_{25}$—O—$)_2PO_2H$ |
| Cpd. 8  | $(n.C_{18}H_{37}$—O—$)_2PO_2H$ |
| Cpd. 9  | $(n.C_{14}H_{29}$—O—$)_2PO_2H$ |
| Cpd. 10 | $p.C_9H_{19}$—$C_6H_4$—O—$(CH_2$—$CH_2$—O$)_{20}$—$PO_3H_2$ |
| Cpd. 11 | $p.C_9H_{19}$—$C_6H_4$—O—$(CH_2$—$CH_2$—O$)_{30}$—$PO_3H_2$ |
| Cpd. 12 | $[p.C_9H_{19}$—$C_6H_4$—O—$(CH_2$—$CH_2$—O$)_{20}]_2$—$PO_2H$ |
| Cpd. 13 | $[p.C_9H_{19}$—$C_6H_4$—O—$(CH_2$—$CH_2$—O$)_{30}]_2$—$PO_2H$ |
| Cpd. 14 | $n.C_8F_{17}$—$SO_2$—$N(C_2H_5)$—$CH_2$—$CH_2$—$OPO_3H_2$ |
| Cpd. 15 | $n.C_{10}H_{21}$—$(O$—$CH_2$—$CH_2)_m$—$OPO_3H_2$ |
| Cpd. 16 | $[n.C_{10}H_{21}$—$(O$—$CH_2$—$CH_2)_m$—$O]_2PO_2H$ | in the above two formulas m represents an integer from 1 to 50.

Said hydrophobizing compounds may be used as emulsifying agents in an aqueous emulsion of a water insoluble oil e.g. linseed oil, types of unhardened or hardened silicon oils. This procedure may allow one to lower the concentration of the hydrophobizing compound in the conversion liquid or in the hydrophobizing liquid.

Bleaching compounds are compounds capable of oxidizing silver. Bleaching compounds are well known in the art and are described e.g. by T. H. James in "The Theory of the Photographic Process", fourth ed., p.447-p.450 Macmillan Publishing Co. Inc., New York (1977). Preferred bleaching compounds for use in connection with the present invention are quinone, iodine, hydrogen peroxide and salts of $Fe^{3+}$, $Cr^{6+}$ and of $S_2O_8^{2-}$.

Preferably the liquid comprising a bleaching compound also comprises a fixing compound and is then called a bleach-fix system. Fixing compounds are compounds capable of reacting with silver ions to a water soluble salt or complex. Fixing compounds are well known in the art and are described e.g. by T. H. James in "The Theory of the Photographic Process", fourth ed., p. 437-p.447 and p. 450-p.453, Macmillan Publishing Co. Inc., New York (1977). Preferred fixing compounds for use in connection with the present invention are ethylenediamine tetraacidic acid and its salts, thiourea and its derivatives, salts of thiosulfate and thiocyanate and the hydrophilizing compounds mentioned before.

However the fixing compound can be present in a separate solution, a so-called fixing solution, that has to be applied to the silver based printing plate during or after the treatment of said plate with a bleaching compound.

The hydrophilizing and/or bleaching compound and the hydrophobizing compounds according to the present invention are preferably used in admixture with each other in a conversion liquid. Preferably the hydrophilizing compound is used in an amount of 0.1 g/l to 10 g/l more preferably in an amount of 0.2 g/l to 5 g/l, the bleaching compound in an amount of 5 g/l to 100 g/l more preferably in an amount of 10 g/l to 50 g/l and the fixing compound in an amount of 5 g/l to 200 g/l more preferably in an amount of 10 g/l to 150 g/l. The hydrophobizing compound is preferably used in a concentration of 0.1 g/l to 10 g/l more preferably in an amount of 0.5 g/l to 5 g/l. In accordance with the present invention two or more hydrophilizing, bleaching, fixing and/or hydrophobizing compounds can be used in admixture with each other.

According to the present invention this conversion liquid is applied to a developed silver based printing plate for example by guiding the silver based printing plate through the conversion liquid or by simply wiping the conversion liquid on the plate. According to the most preferred embodiment in connection with the present invention, the conversion liquid may replace the finishing liquid that is sometimes used at the end of the processing of a silver based printing plate to increase the hydrophobic character of the silver image.

According to a further embodiment of the present invention the hydrophilizing compound, the bleaching compound and the hydrophobizing compound may be contained in respectively a hydrophilizing liquid, a bleaching liquid and a hydrophobizing liquid. Said liquids each independently may be an aqueous solution or an aqueous emulsion. Said hydrophilizing liquid and said hydrophobizing liquid may be applied as described above in whatever sequence on the silver based printing plate. Alternatively said hydrophobizing liquid and said bleaching liquid may be applied as described above in the sequence given on the silver based printing plate. Said hydrophilizing liquid and/or bleaching liquid and said hydrophobizing liquid may also be mixed at the surface of the printing plate.

More preferably, the hydrophilizing liquid is already used in one or more of the steps comprised in the preparation of the silver based printing plate e.g. the developing-step and/or respectively the neutralizing step or the washing step f.i. by adding the hydrophilizing liquid to the liquid used in these steps, the so obtained solution containing the hydrophilizing compound in a concentration of 0.1 g/l to 10 g/l, more preferably in an amount of 0.5 g/l to 5 g/l.

The conversion liquid or the hydrophilizing liquid may contain a small amount of a bleaching compound, preferably from 0.1 g/l to 10 g/l.

The conversion liquid, the bleaching liquid, the hydrophilizing liquid and/or the hydrophobizing liquid may contain additional ingredients such as for example hydrophilic polymers, preservative agents, wetting agents etc. Preferably the pH of said liquids is between 2.5 and 7.

Preferably the contact time between the silver based printing plate and the conversion liquid, the bleaching liquid, the hydrophilizing liquid and/or the hydrophobizing liquid are from 20 s to 600 s, more preferably from 30 s to 300 s.

Preferably the temperature of the conversion liquid, the bleaching liquid, the hydrophilizing liquid and/or the hydrophobizing liquid ranges from 15° C. to 50° C. more preferably from 20° C. to 35° C.

Suitable silver based printing plates that can be treated in accordance with the present invention are e.g. printing plates obtained according to the silver salt diffusion transfer process.

According to one embodiment such a plate can be made as described in U.S. Pat. No. 5,059,508 by a process comprising the steps of:
  image-wise exposing an imaging element comprising on a support a photosensitive layer comprising a silver halide emulsion and an image receiving layer containing physical development nuclei,
  developing said imaging element in the presence of developing agent(s) and silver halide solvent(s) using an alkaline processing liquid and
  neutralizing a thus obtained developed imaging element using a neutralization liquid.

According to another embodiment such a plate can be made by a process comprising the steps of:
  image-wise exposing an imaging element comprising on a support a photosensitive silver halide emulsion layer,
  developing said imaging element whilst in contact with an image receiving material comprising on an hydrophilic surface of a support an image receiving layer containing physical development nuclei using an aqueous alkaline processing solution in the presence of developing agent(s) and silver halide solvent(s) and
  separating said imaging element and image receiving material from each other.

According to the most preferred embodiment such a plate is made by a process comprising the steps of:
  image-wise exposing an imaging element comprising in the order given on a hydrophilic surface of a support (i) an image receiving layer containing physical development nuclei and (ii) a photosensitive layer comprising a photosensitive silver halide emulsion said photosensitive layer being in water permeable relationship with said image receiving layer,
  applying an aqueous alkaline solution to the imaging element in the presence of a developing agent and a silver halide solvent to form a silver image in said image receiving layer,
  treating the imaging element to remove the layer(s) on top of the image receiving layer, preferably by washing the imaging element with rinsing water, thereby exposing the imaged surface of the support by uncovering said silver image formed in said image receiving layer, The present invention is illustrated by way of the following examples without however the intention to limit the invention thereto.

EXAMPLE 1 (Comparison)

Four conversion liquids A-D were prepared having the following composition:

| | |
|---|---|
| Guanidinium salt of 4-mercapto-n.butylsulphonic acid | 1 g |
| Hydrophobizing agent of table 2 above | 1 g |
| Water to make | 1 l |
| NaHSO₄ to adjust pH to | 3 |
| Conversion liquid A contained Cpd. 3, liquid B Cpd. 4, liquid C Cpd. 8 and liquid D Cpd. 14 all of table 2. | |

Silver based lithographic printing plates having a roughened and anodized aluminium support were prepared according to the silver salt diffusion transfer process as described in EP-A-410500, example. 2, with however deleting the treatment with the fixer. The thus obtained silver based printing plates were each treated with a conversion liquid as described above by dipping the plates for 3 min. into the conversion liquid at 20° C.

They were subsequently left to dry in the air for 1 hour. As a control one silver based printing plate was not treated with a conversion liquid. Each of the printing plates was used to print on an offset press using a commonly employed fountain and a greasy ink.

It was found that with the control positive copies were obtained, i.e. the image areas were printed while the printing plates that were treated with the conversion liquid yielded negative copies i.e. the image areas were not printed whereas the background areas of the original were printed.

Each of the printing plates yielded an excellent differentation between printing and non-printing areas and yielded a high printing endurance.

EXAMPLE 2 (Comparison)

A conversion liquid E was prepared having the same composition as conversion liquid A of example 1 but containing in addition 5 g of $Fe^{3+}$ ethylenediamine teteaacetic acid.

A silver based lithographic printing plates prepared as described in example 1 was treated with conversion liquid E and dried as described in example 1. As a control a second silver based printing plate was not treated with the conversion liquid E. Each of both printing plates was used to print on an offset press using a commonly employed fountain and a greasy ink.

The same results as in the previous example were found.

EXAMPLE 3 (Comparison)

A hydrophobizing liquid F was prepared having the following composition:

| | |
|---|---|
| Cpd. 3 table 2 | 1 g |
| Water to make | 1 l |
| NaHSO₄ to adjust pH to | 3 |

A silver based lithographic printing plates was prepared as described in example 1 (comparative sample). Four other silver based lithographic printing plates were prepared in an identical way with the proviso that the developing solution as described in example 1 further contained a hydrophilising compound: respectively 4-mercaptobutylsulphonic acid, 2-mercapto,1-aminoethylcarbonic acid, 2-mercapto-1-carboxymethyl-tetrazole and 2-mercapto-1-carboxyphenyl-tetrazole and that these last 4 plates were treated with hydrophobizing liquid F by dipping the plates for 3 min. into the hydrophobizing liquid at 20° C. and dried as described in example 1. Each of the printing plates was used to print on an offset press using a commonly employed fountain and a greasy ink.

The same results as in the previous examples were found.

EXAMPLE 4 (Comparison)

A bleaching liquid G was prepared having the following composition:

| | |
|---|---|
| Sodium ferricyanide | 25 g |
| Thioureum | 10 g |
| Sodium thiosulfate | 125 g |
| Sodium nitrate | 10 g |
| Polyglycol 3000 | 75 g |
| Water to make | 1 l |
| NaH₂PO₄ to adjust pH to | 6 |

A silver based lithographic printing plates prepared as described in example 1 was treated with the hydrophobizing liquid F of example 3 by dipping the plate for 3 min. into the hydrophobizing liquid at 20° C. Subsequently said plate was treated with the bleaching liquid G by dipping the plate for 3 min. into the bleaching liquid at 20° C. and dried as described in example 1. As a control a second silver based printing plate was left as such. Each of both printing plates was used to print on an offset press using a commonly employed fountain and a greasy ink.

The same results as in the previous examples were found.

EXAMPLE 5 (Comparison)

A hydrophobizing liquid H was prepared having the following composition:

| | |
|---|---|
| Cpd. 3 of table 2 | 0.1 g |
| Linseed oil | 5 g |
| Water to make | 1 l |
| NaHSO₄ to adjust pH to | 3 |

A silver based lithographic printing plates prepared as described in example 1 was treated as described in example 4 except that the hydrophobizing liquid H was substituted for the hydrophobizing liquid F of example 4. As a control a second silver based printing plate was left as such. Each of both printing plates was used to print on an offset press using a commonly employed fountain and a greasy ink.

The same results as in the previous examples were found.

We claim:

1. A conversion liquid for converting silver areas of a silver based printing plate into ink repellant areas while rendering background areas of said silver based printing plate ink accepting, said conversion liquid comprising a hydrophobizing compound capable of adsorbing to said hydrophilic background areas and contains a hydrophobic group and a group capable of adsorbing to an aluminum oxide or silicium oxide surface and a hydrophilizing compound capable of adsorbing to said silver areas and/or a bleaching compound capable of oxidizing the silver in said silver based printing plate and said hydrophobizing compound corresponding to the following formula:

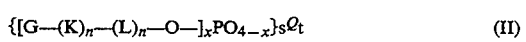

$$\{[G\text{---}(K)_n\text{---}(L)_n\text{---}O\text{---}]_x PO_{4-x}\}_s Q_t \qquad (II)$$

wherein G represents an alkyl, alkenyl or alkynyl group having at least 6 carbon atoms, an aryl, an alkylaryl or an aralkyl;

K represents a carbonamido or sulphonamido group;

L represents an alkylene oxide or polyalkylene oxide;

n represents 0 or 1;

x represents 1 or 2;

s and t represent the smallest integers to obtain a neutral compound;

Q represents a hydrogen, a metal cation or $NH_4^+$.

2. A conversion liquid according to claim 1 wherein said hydrophilizing compound corresponds to the following formula:

$$MS—R—A \qquad (I)$$

wherein M represents hydrogen, a metal cation or $NH_4^+$; B represents a divalent linking group and A represents a hydrophilic group.

3. A conversion liquid according to claim 1 wherein the bleaching compound capable of oxidizing the silver in said silver based printing plate is quinone, iodine, hydrogen peroxide or a salt of $Fe^{3+}$, of $Cr^{6+}$ or of $S_2O_8^{2-}$.

4. A package containing a hydrophilizing liquid and/or a bleaching liquid and a hydrophobizing liquid for use in combination with each other so as to convert silver areas of a silver based printing plate into ink repellant areas and to render background areas of said silver based printing plate ink accepting, said hydrophobizing liquid comprising a hydrophobizing compound capable of adsorbing to said hydrophilic background areas and contains a hydrophobic group and a group capable of adsorbing to an aluminum oxide or silicium oxide surface, said hydrophilizing liquid comprising a hydrophilizing compound capable of adsorbing to said silver areas and said bleaching liquid comprising a bleaching compound capable of oxidizing the silver in said silver based printing plate and said hydrophobizing compound corresponding to the following formula:

$$\{[G—(K)_n—(L)_n—O—\}_xPO_{4-x}\}_sQ_t \qquad (II)$$

wherein G represents an alkyl, alkyenyl or alkynyl group having at least 6 carbon atoms, an aryl, an alkylaryl or an aralkyl;

K represents a carbonamido or sulphonamido group;

L represents an alkylene oxide or polyalkylene oxide;

n represents 0 or 1;

x represents 1 or 2;

s and t represent the smallest integers to obtain a neutral compound;

Q represents a hydrogen, a metal cation or $NH_4^+$.

5. A package according to claim 4 wherein the hydrophilizing liquid contains a hydrophilizing compound according to following formula (I) is used:

$$MS—R—A \qquad (I)$$

wherein M represents hydrogen, a metal cation e.g. $Na^+$, $K^+$ etc. or $NH_4^+$; R represents a divalent linking group and A represents a hydrophilic group; and wherein the beaching liquid contains a bleaching compound being quinone iodine, hydrogen peroxide or a salt of $Fe^{3+}$, of $Cr^{6+}$ or of $S_2O_8^{2-}$.

* * * * *